(12) United States Patent
Kim

(10) Patent No.: US 6,577,436 B2
(45) Date of Patent: Jun. 10, 2003

(54) WAVELENGTH CONVERTER

(75) Inventor: Jong-Ryeol Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 265 days.

(21) Appl. No.: 09/800,742

(22) Filed: Mar. 8, 2001

(65) Prior Publication Data

US 2001/0021060 A1 Sep. 13, 2001

(30) Foreign Application Priority Data

Mar. 10, 2000 (KR) ........................... 11924/2000

(51) Int. Cl.[7] ................................................ G02F 1/365
(52) U.S. Cl. ........................................ 359/332; 359/326
(58) Field of Search ............................... 359/326–332

(56) References Cited

U.S. PATENT DOCUMENTS

| 5,106,193 | A | | 4/1992 | Fesler et al. ............... 356/350 |
|---|---|---|---|---|
| 5,264,960 | A | | 11/1993 | Glance ....................... 359/344 |
| 5,734,493 | A | | 3/1998 | Jopson ....................... 359/326 |
| 5,940,207 | A | | 8/1999 | Weich et al. ............... 359/333 |
| 6,005,708 | A | * | 12/1999 | Leclerc et al. ............. 359/326 |
| 6,008,931 | A | | 12/1999 | von Helmolt et al. ...... 359/326 |
| 6,046,841 | A | * | 4/2000 | Mahgerefteh et al. ...... 359/326 |
| 6,069,732 | A | | 5/2000 | Koch et al. ................. 359/344 |
| 6,101,027 | A | | 8/2000 | Lee et al. ................... 359/344 |
| 6,115,173 | A | | 9/2000 | Tanaka et al. ............. 359/333 |
| 6,118,566 | A | | 9/2000 | Price .......................... 359/181 |
| 6,208,454 | B1 | * | 3/2001 | Koren et al. ............... 359/326 |
| 6,256,137 | B1 | * | 7/2001 | Hironishi .................... 359/332 |
| 6,282,015 | B1 | * | 8/2001 | Ueno ......................... 359/332 |
| 6,323,992 | B1 | * | 11/2001 | Ueno ......................... 359/332 |
| 6,337,762 | B1 | * | 1/2002 | Ueno ......................... 359/332 |

\* cited by examiner

Primary Examiner—John D. Lee
(74) Attorney, Agent, or Firm—Robert E. Bushnell, Esq.

(57) ABSTRACT

A wavelength converter is provided. The wavelength converter includes a substrate; first and second semiconductor optical amplifiers (SOAs) provided in parallel on the substrate, each of the SOAs including a first portion which passes light at one end, and a second portion which passes light at the opposite end; a first waveguide connected to the second portions of the first and second SOAs; a second waveguide connected to the first portion of the first SOA; and a third waveguide connected to the first portions of the first and second SOAs. The first through third waveguides are arranged on one side of the substrate in the vicinity of the first portions of the first and second SOAs. The first waveguide is connected to the second portions of the first and second SOAs through a unit for changing an optical progressing path.

20 Claims, 2 Drawing Sheets

WAVELENGTH CONVERTER

CLAIM OF PRIORITY

This application makes reference to, incorporates the same herein, and claims all benefits accruing under 35 U.S.C. §119 from my application WAVELENGTH CONVERTER filed with the Korean Industrial Property Office on Mar. 10, 2000 and there duly assigned Ser. No. 11924/2000.

BACKGROUND OF THE INVENTION

1. Field of the Invention

The present invention relates to a wavelength converter, and more particularly, to a wavelength converter which can easily be matched with an optical fiber bundle.

2. Description of the Related Art

Semiconductor optical amplifiers (SOAs) use the gain characteristic of a semiconductor to amplify a light signal. When input light passes an SOA, output light is amplified by the gain of the SOA. SOAs are fundamentally very similar to semiconductor laser devices.

For a wavelength conversion device, an SOA and a passive wave guide are formed on a single substrate, and a wavelength is converted due to a change in the refractivity of a medium, which is caused by interference between input light and pumping light, and due to a cross phase modulation (XPM) effect, which is caused by the change in the refractivity.

The combination of an SOA and a passive waveguide is implemented by monolithic integration or hybrid integration. Hybrid integration, which employs a planar lightwave circuit (PLC) as a waveguide, has been highlighted because it is simple to manufacture and it has a low coupling loss.

In such a conventional wavelength converter, optical fibers are provided at both ends of a substrate, and thus optical fibers must be coupled to ports one to one. However, in such a structure in which the ports are separated at both sides of the substrate, it is very difficult to arrange fibers, and thus the yield of a wavelength converter module is very low and the cost is very high. What is needed is a wavelength converter where the input and the output ends are on the same side of the substrate of the wavelength converter, thus allowing only one optical fiber bundle to be connected to the wavelength converter.

SUMMARY OF THE INVENTION

To solve the above problem, it is an object of the present invention is to provide a wavelength converter for facilitating the convenient arrangement of optical fibers.

It is yet another object of the present invention is to provide a wavelength converter for reducing the manufacturing cost and increasing yield.

It is further an object to provide a wavelength converter where the input and the output of the wavelength converter are on the same side of the wavelength converter and in close proximity with each other.

It is still another object of the present invention to provide a wavelength converter that allows only one optical fiber bundle to be connected to the wavelength converter, the optical bundle containing fibers for both the inputs and the output of the wavelength converter.

To achieve the above objects of the invention, there is provided a wavelength converter including a substrate; first and second semiconductor optical amplifiers (SOAs) provided in parallel on the substrate, each of the SOAs including a first portion which passes light at one end, and a second portion which passes light at the opposite end; a first waveguide connected to the second portions of the first and second SOAs; a second waveguide connected to the first portion of the first SOA; and a third waveguide connected to the first portions of the first and second SOAs. The first through third waveguides are arranged on one side of the substrate in the vicinity of the first portions of the first and second SOAs. The first waveguide is connected to the second portions of the first and second SOAs through a unit for changing an optical progressing path.

Preferably, the wavelength converter further includes an antireflective coating layer on one end facet of the substrate on which the waveguides are arranged.

The first waveguide includes a first path extending from the second portions of the first and second SOAs toward one end of the substrate facing the second portions, a second path extending in a direction perpendicular to the first path, and a third path extending from the second path back toward the side of the substrate where the first through third waveguides are arranged, the third path disposed in parallel to the second and third waveguides. Particularly, the unit for changing an optical progressing path includes first and second mirrors, which are provided at the intersection of the first and second paths of the first waveguide and at the intersection of the second and third paths of the first waveguide, respectively. It is preferable that each of the first and second mirrors is realized as one facet of an etched portion formed on the substrate.

In another embodiment, the first waveguide includes a first path expending from the second portions of the first and second SOAs toward one end of the substrate facing the second portions, an arc-shaped second path extending from the first path and curving toward the side of the substrate where the first through third waveguides are arranged in an arc shape, the second path providing the unit for changing an optical progressing path, and a third path extending from the second path back toward the side of the substrate where the first through third waveguides are arranged, the third path disposed in parallel to the second and third waveguides.

BRIEF DESCRIPTION OF THE DRAWINGS

A more complete appreciation of the invention, and many of the attendant advantages, thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
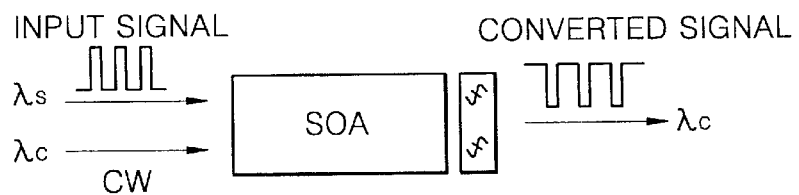
FIG. 1 is a diagram for explaining a close phase modulation (XGM) wavelength converter having a forward structure.
Figure 2:
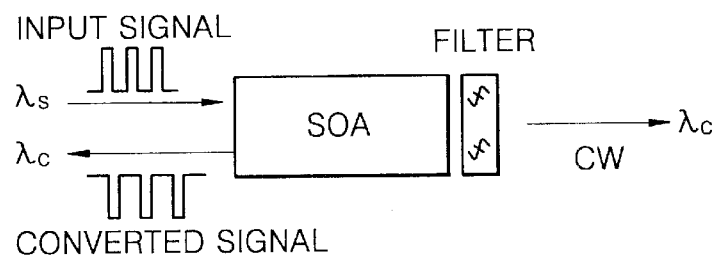
FIG. 2 is a diagram for explaining an XGM wavelength converter having a reverse structure.

Turning to the figures, FIG. 1 is a diagram for explaining a wavelength converter having a forward structure, and FIG. 2 is a diagram for explaining cross gain modulation (XGM) wavelength converter having a reverse structure. In wavelength conversion, the gain of an SOA varies with a modulated input signal having a wavelength of $\lambda s$, and the gain of a continuous wave (CW) signal of a desired wavelength of $\lambda c$ is modulated due to gain saturation so that information embedded in input light is converted into an output signal of a desired wavelength of $\lambda c$. Since the input signal is applied to the CW signal due to the gain saturation, the output signal is inverted.

As shown in FIGS. 1 and 2, an input signal and a CW signal may be input to an SOA in a forward or reverse direction. When the signals are input in the reverse direction, a filter used when the signals are input in the forward direction is not required when obtaining a converted signal.

Figure 3:
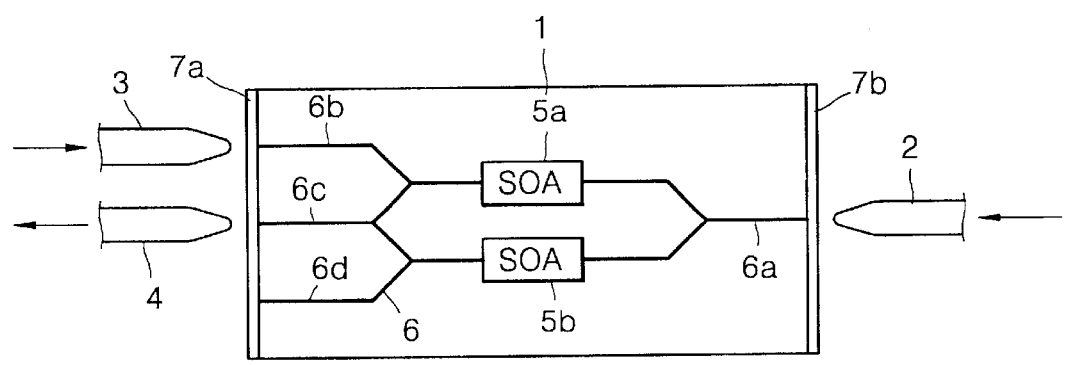
FIG. 3 is a schematic plan view showing the configuration of a conventional wavelength converter including a semiconductor optical amplifier (SOA) and a waveguide.

FIG. 3 shows the schematic configuration of a conventional XPM wavelength converter. Two SOAs are provided in the middle of a substrate 1. First through fourth waveguides 6a, 6b, 6c and 6d are formed at both sides of the two SOAs. A first optical fiber 2 for providing input light through the first waveguide 6a is disposed at one end of the substrate 1. A second optical fiber 3 for providing CW pumping light through the second waveguide 6b, and a third optical fiber 4 for receiving converted output light through the third waveguide 6c, are disposed at the opposite end. The fourth waveguide 6d as a dummy waveguide is not used, and may not always be provided. The first waveguide 6a leads the input light to both SOAs. Antireflective coatings 7a and 7b are formed on both end facets of the substrate 1 facing the optical fibers 2, 3 and 4.

The third waveguide 6c is divided and connected to both SOAs. The second waveguide 6b is connected to the third waveguide 6c. The CW pumping light input to the second waveguide 6b is introduced into the upper SOA. The output lights from the upper and lower SOAs interfere with each other and thus are converted while passing the third waveguide 6c. The converted light is output through the third optical fiber 4.

Figure 4:
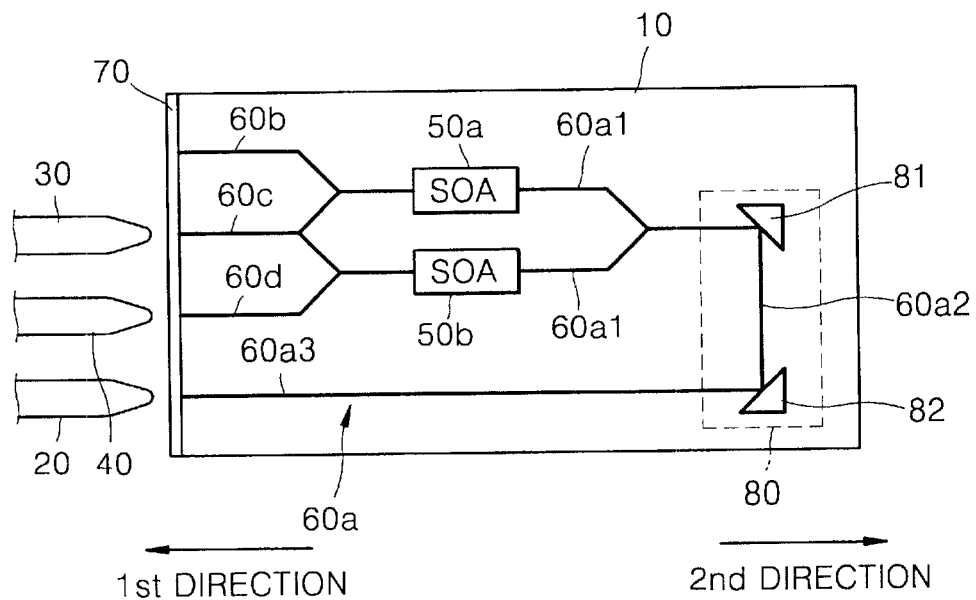
FIG. 4 is a schematic plan view showing the configuration of a wavelength converter including an SOA and a waveguide according to a first embodiment of the present invention.

FIG. 4 illustrates the first embodiment of the present invention. Referring to FIG. 4, first and second semiconductor optical amplifiers (SOAs) 50a and 50b are provided in the middle of a substrate 10. First, second, third and fourth waveguides 60a, 60b, 60c and 60d are provided at one end of the substrate 10 (on the left side of the diagram) in parallel. An antireflective (AR) coating 70 is formed on the end facet of the substrate 10 in the vicinity of the first through fourth waveguides 60a through 60d. First, second and third optical fibers 20, 30 and 40 corresponding to first, third and fourth waveguides 60a, 60c and 60d, respectively, are disposed in parallel at one end of the substrate 10, on which the AR coating layer 70 is formed.

The second, third and fourth waveguides 60b, 60c and 60d extend in a second direction and are connected to a first portion of each of the first and second SOAs 50a and 50b, and the first waveguide 60a is connected to a second portion of each of the first and second SOAs 50a and 50b. For this, the first waveguide 60a includes a first path 60a1, which extends from the first and second SOAs 50a and 50b in the second direction, a second path 60a2, which extends in a direction perpendicular to the first path 60a1, and a third path 60a3, which extends in the first direction back toward the AR coating layer 70.

First and second reflection mirrors 81 and 82, which construct a means 80 for changing an optical progressing path, are provided at the intersection of the first and second paths 60a1 and 60a2 and at the intersection of the second and third paths 60a2 and 60a3, respectively. The second waveguide 60b is a dummy waveguide which is not used and sometimes may be omitted.

The first and second reflection mirrors 81 and 82 are formed by etching. One facet of the etched portion functions as a total internal reflection (TIR) mirror at the intersection of the first and second paths 60a1 and 60a2. One facet of the other etched portion functions as a TIR mirror at the intersection of the second and third paths 60a2 and 60a3.

Figure 5:
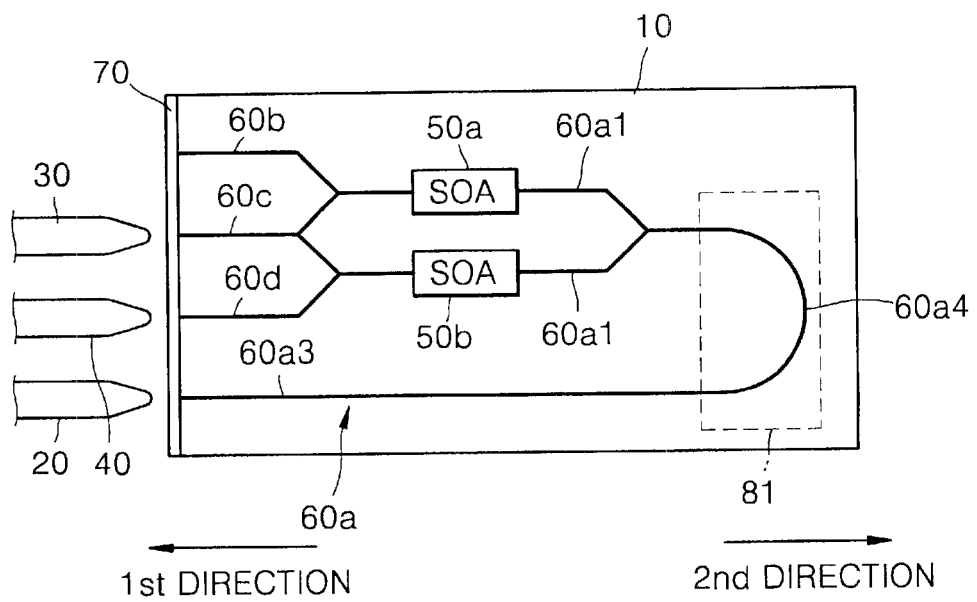
FIG. 5 is a schematic plan view showing the configuration of a wavelength converter including an SOA and a waveguide according to a second embodiment of the present invention.

FIG. 5 illustrates the second embodiment of the present invention. Referring to FIG. 5, first and second semiconductor optical amplifiers (SOAs) 50a and 50b are provided in the middle of a substrate 10. First, second, third and fourth waveguides 60a, 60b, 60c and 60d are provided at one end of the substrate 10 (on the left side of the diagram) in parallel. An antireflective (AR) coating 70 is formed on the end facet of the substrate 10 in the vicinity of the first through fourth waveguides 60a through 60d. First, second and third optical fibers 20, 30 and 40 corresponding to first, third and fourth waveguides 60a, 60c and 60d, respectively, are disposed in parallel at one end of the substrate 10, on which the AR coating layer 70 is formed.

The second, third and fourth waveguides 60b, 60c and 60d extend in a second direction and are connected to a first portion of each of the first and second SOAs 50a and 50b, and the first waveguide 60a is connected to a second portion of each of the first and second SOAs 50a and 50b through a means 81 for changing an optical progressing path. The means 81 for changing an optical progressing path is realized as a curved arc second path 60a4. That is, the first waveguide 60a includes a first path 60a1, which extends from the first and second SOAs 50a and 50b in the second direction, the arc-shaped second path 60a4, which is connected to the first path 60a1, and a third path 60a3, which extends from the second path 60a4 in the first direction back toward the AR coating layer 70. The second waveguide 60b is a dummy waveguide which is not used and may sometimes be omitted.

As described in the first and second embodiments, in a wavelength converter according to the present invention, ports (end portions of waveguides) corresponding to optical fibers are arranged at one side of a substrate so that an AR coating layer is just formed on one side of the substrate, thereby facilitating easy manufacture compared to a conventional wavelength converter which is provided with AR coating layers on both sides of a substrate. In addition, since the ports are provided at one side of the substrate, the optical fibers can be arranged at one side. Accordingly, the present invention facilitates the convenient arrangement of optical fibers, which is the most difficult part in manufacturing a conventional wavelength converter. That is, three optical fibers can be combined into a bundle in which the optical fibers are spaced to correspond to the waveguides, which are arranged at one side of the substrate. Accordingly, the optical fibers can be matched with the corresponding waveguides (ports) by a single arrangement process of disposing the bundle of the optical fibers at one side of the substrate.

According to the present invention, fibers for optical conversion devices are easily arranged, and an AR coating layer is formed on just one side of a substrate, thereby simplifying the manufacturing processes. In addition, optical fibers can be matched to corresponding waveguides in a bundle state, thereby reducing necessary working time. Consequently, yield is improved, and optical loss caused by coupling error is minimized.

The present invention is proper to a Mach-Zehnder interferometric wavelength converter which is essentially used for preventing wavelength contention in a wavelength division multiplexing (WDM) system.

Although the invention has been described with reference to a particular embodiment, it will be apparent to one of ordinary skill in the art that modifications to the described embodiment may be made without departing from the spirit and scope of the invention. Thus, the true technical protection scope of the present invention must be determined by the attached claims.

What is claimed is:

1. A wavelength converter comprising:
   a substrate;
   a first and a second semiconductor optical amplifier (SOAs) disposed on said substrate, each of the SOAs comprising a first portion which passes light at one end, and a second portion which passes light at the opposite end;
   a first waveguide connected to the second portions of the first and second SOAs;
   a second waveguide connected to the first portion of the first SOA; and
   a third waveguide connected to the first portions of the first and second SOAs, the first, the second, and the third waveguides are arranged on one side of the substrate in the vicinity of the first portions of the first and second SOAs; and
   means for changing an optical progressing path of said first waveguide so that said first waveguide emerges on the same side of said substrate as the second and third waveguides.

2. The wavelength converter of claim 1, further comprising an anti-reflective coating layer on one end facet of the substrate on which the first, the second and the third waveguides are arranged.

3. The wavelength converter of claim 2, wherein the first waveguide comprises;
   a first path extending from the second portions of the first and second SOAs toward one end of the substrate facing the second portions;
   a second path extending in a direction perpendicular to the first path; and
   a third path extending from the second path back toward the side of the substrate where the first, second and third waveguides are arranged, the third path disposed in parallel to the second and third waveguides.

4. The wavelength converter of claim 3, wherein said means for changing an optical progressing path comprises first and second mirrors, that are provided at the intersection of the first and second paths of the first waveguide and at the intersection of the second and third paths of the first waveguide, respectively.

5. The wavelength converter of claim 4, wherein each of the first and second mirrors is realized as one facet of an etched portion formed on the substrate.

6. The wavelength converter of claim 2, wherein the first waveguide comprises;
   a first path extending from the second portions of the first and second SOAs toward one end of the substrate facing the second portions;
   an arc-shaped second path extending from the first path and curving toward the side of the substrate where the first, second and third waveguides are arranged in an arc shape, the second path providing the means for changing an optical progressing path; and
   a third path extending from the second path back toward the side of the substrate where the first, second and third waveguides are arranged, the third path disposed in parallel to the second and third waveguides.

7. The wavelength converter of claim 1, wherein said means for changing an optical progressing path comprises an arc-shaped path for said first waveguide.

8. The wavelength converter of claim 7, wherein said arc-shaped path forms a 180 degree angle.

9. The wavelength converter of claim 1, wherein said first and said second SOA's are in parallel to each other on said substrate.

10. A wavelength converter formed on a substrate, said wavelength converter comprising:
    a first and a second semiconductor optical amplifier located on said substrate, said first and said second semiconductor optical amplifier each having an input end and an output end opposite to said input end;
    a first waveguide located on one side of said substrate, said first waveguide connected to said output ends of said first and said second semiconductor optical amplifiers;
    a second waveguide located on said one side of said substrate, said second waveguide connected to one input end of a group comprising said first semiconductor optical amplifier and said second semiconductor optical amplifier;
    a third waveguide located at said one side of said substrate, said third waveguide connected to both input ends of said first and said second semiconductor optical amplifiers.

11. The wavelength converter of claim 10, wherein light is input to said substrate via said second and said third waveguides and light is output from said substrate via said first waveguide.

12. The wavelength converter of claim 10, said one side of said substrate being coated with an anti-reflective coating.

13. The wavelength converter of claim 10, wherein the first waveguide comprises;
    a first path extending from said output ends of said first and said second semiconductor optical amplifiers toward a side of said substrate opposite said one side of said substrate;
    a second path extending in a direction perpendicular to the first path; and
    a third path extending from the second path towards said one side of said substrate, wherein a first mirror is located at a junction of said first path and said second path and a second mirror is located at a junction of said second path and said third path.

14. The wavelength converter of claim 13, wherein each of the first and second mirrors is realized as one facet of an etched portion formed on said substrate.

15. The wavelength converter of claim 10, wherein the first waveguide comprises;
    a first path extending from said output ends of said first and second semiconductor optical amplifiers towards an end of the substrate opposite said one side of said substrate;
    a second path extending from said first path and curving 180 degrees around to face said one side of said substrate; and a third path extending from said second path to said one side of said substrate.

16. A method for wavelength conversion, comprising the steps of:

providing a substrate having a first semiconductor optical amplifier and a second semiconductor optical amplifier;

providing a first waveguide, a second waveguide, and a third waveguide, each emerging on one edge of said substrate;

illuminating said first and said second waveguides with monochromatic light from a first source and a second source respectively;

illuminating said first semiconductor optical amplifier with light from said first waveguide;

illuminating said second semiconductor optical amplifier with light from said second waveguide;

combining outputs from said first semiconductor optical amplifier and said second semiconductor amplifier into said third waveguide; and outputting light from said third waveguide in a direction opposite to light from said first source and said second source.

17. The method of claim 16, wherein said second semiconductor amplifier is also illuminated with light from said first waveguide.

18. The method of claim 17, wherein optical beam splitters and optical beam combiners are employed to split optical beams and combine optical beams respectively.

19. The method of claim 17, wherein reflection mirrors are used in said third waveguide to redirect light in said third waveguide to propagate in a direction opposite from a propagation direction of said first light source and said second light source.

20. The method of claim 17, wherein said third waveguide has a curved portion of 180 degrees to redirect light in said third waveguide to propagate in a direction opposite from a propagation direction of said first light source and said second light source.

* * * * *